(12) United States Patent
Bonecutter et al.

(10) Patent No.: US 11,404,297 B2
(45) Date of Patent: Aug. 2, 2022

(54) SYSTEMS, APPARATUS, AND METHODS FOR AN IMPROVED LOAD PORT

(71) Applicant: Applied Materials, Inc., Santa Clara, CA (US)

(72) Inventors: Luke W. Bonecutter, Cedar Park, TX (US); David T. Blahnik, Round Rock, TX (US); Paul B. Reuter, Austin, TX (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 17/093,391

(22) Filed: Nov. 9, 2020

(65) Prior Publication Data
US 2021/0057249 A1 Feb. 25, 2021

Related U.S. Application Data

(60) Continuation of application No. 16/284,675, filed on Feb. 25, 2019, now Pat. No. 10,832,928, which is a division of application No. 15/348,967, filed on Nov. 10, 2016, now Pat. No. 10,262,884.

(51) Int. Cl.
*H01L 21/673* (2006.01)
*H01L 21/677* (2006.01)

(52) U.S. Cl.
CPC .. *H01L 21/67389* (2013.01); *H01L 21/67766* (2013.01); *H01L 21/67772* (2013.01); *H01L 21/67775* (2013.01); *H01L 21/67778* (2013.01)

(58) Field of Classification Search
CPC ......... H01L 21/67389; H01L 21/67775; H01L 21/67772; H01L 21/67393; H01L 21/67379; H01L 21/67376; H01L 21/67766; H01L 21/67778
See application file for complete search history.

(56) References Cited

U.S. PATENT DOCUMENTS

| | | | |
|---|---|---|---|
| 5,586,585 A | 12/1996 | Bonora et al. |
| 6,050,891 A | 4/2000 | Nering |
| 7,789,609 B2 | 9/2010 | Okabe et al. |
| 8,302,637 B2 | 11/2012 | Okabe |
| 8,936,050 B2 | 1/2015 | Sugawara |
| 9,010,384 B2 | 4/2015 | Yoshimura |
| 9,536,765 B2 | 1/2017 | Iwamoto |
| 10,159,169 B2 | 12/2018 | Vincent et al. |
| 10,262,884 B2 | 4/2019 | Bonecutter et al. |

(Continued)

FOREIGN PATENT DOCUMENTS

| | | |
|---|---|---|
| JP | 2000357641 A | 12/2000 |
| WO | 2015023591 A1 | 2/2015 |

OTHER PUBLICATIONS

International Search Report and Written Opinion dated Feb. 21, 2018, on application No. PCT/US2017/060949.

*Primary Examiner* — Nicolas A Arnett
(74) *Attorney, Agent, or Firm* — Lowenstein Sandler LLP

(57) ABSTRACT

A load port system includes an isolation compartment coupled to an equipment front end module (EFEM). Reactive gas is to be removed from the isolation compartment. The load port system further includes an elevator disposed in the isolation compartment. The elevator is coupled to an elevator arm that extends from the isolation compartment into the EFEM through an opening to raise and lower a carrier opener within the EFEM.

20 Claims, 7 Drawing Sheets

(56) References Cited

U.S. PATENT DOCUMENTS

| | | | |
|---|---|---|---|
| 10,269,603 B2* | 4/2019 | Nakagawa | H01L 21/67253 |
| 10,312,122 B2 | 6/2019 | Ogawa et al. | |
| 10,354,903 B2* | 7/2019 | Sakata | H01L 21/67775 |
| 10,431,481 B2 | 10/2019 | Wakabayashi | |
| 10,446,428 B2* | 10/2019 | Reuter | H01L 21/67775 |
| 10,832,928 B2* | 11/2020 | Bonecutter | H01L 21/67766 |
| 11,081,379 B2* | 8/2021 | Reuter | H01L 21/67775 |
| 2008/0134483 A1 | 6/2008 | Aburatani | |
| 2009/0110518 A1 | 4/2009 | Rice | |
| 2011/0070055 A1 | 3/2011 | Sasak et al. | |
| 2012/0261031 A1 | 6/2012 | Okabe | |
| 2013/0031537 A1 | 1/2013 | Boehm et al. | |
| 2014/0369793 A1 | 12/2014 | Hall et al. | |
| 2015/0024671 A1 | 1/2015 | Taniyama et al. | |
| 2015/0045961 A1 | 2/2015 | Koshti et al. | |
| 2015/0162229 A1 | 6/2015 | Tanimura et al. | |
| 2015/0221538 A1 | 8/2015 | Ochiai et al. | |
| 2016/0147235 A1 | 5/2016 | Rice et al. | |
| 2017/0221743 A1 | 8/2017 | Kondoh et al. | |
| 2018/0114710 A1 | 4/2018 | Jeong et al. | |
| 2018/0130684 A1 | 5/2018 | Reuter et al. | |
| 2018/0130685 A1 | 5/2018 | Bonecutter et al. | |
| 2018/0130686 A1 | 5/2018 | Blahnik et al. | |
| 2018/0130687 A1 | 5/2018 | Bonecutter | |

* cited by examiner

SYSTEMS, APPARATUS, AND METHODS FOR AN IMPROVED LOAD PORT

RELATED APPLICATIONS

This application is a continuation application of U.S. patent application Ser. No. 16/284,675, filed on Feb. 25, 2019, which is a divisional application of U.S. patent application Ser. No. 15/348,967, filed Nov. 10, 2016, now issued U.S. Pat. No. 10,262,884, the entire contents of which are hereby incorporated by reference herein.

FIELD

The present application relates to electronic device manufacturing systems, and more specifically to systems, apparatus, and methods for an improved load port for such systems.

BACKGROUND

Oxygen from a cleanroom can have deleterious effects on substrates (e.g., semiconductor wafers) such as oxidation. Thus, substrates are typically stored in sealed carriers and/or kept in a non-reactive gas (e.g., nitrogen) environment. Electronic device processing systems use load ports coupled to equipment front end modules (EFEMs) or factory interfaces between the cleanroom and the processing tools. Operators or material handling systems can load substrate carriers onto the load ports so the substrates can be loaded into and removed from the processing systems. The cleanrooms have oxygen environments for the operators while the EFEM for the processing systems typically have nitrogen environments to protect the substrates.

Ideally, the EFEM provides a barrier to keep oxygen out of the processing system but in some cases, the load port may contribute to oxygen contamination. Thus, what is sought are systems, apparatus, and methods for an improved load port.

SUMMARY

In some embodiments, a load port system is provided. The system includes a frame supporting a dock and a carrier opener; an elevator operable to raise and lower the carrier opener; an isolation compartment within which the elevator is operable to move, the isolation compartment including a volume isolated from a volume of an equipment front end module (EFEM); and a purge supply within the isolation compartment operable to purge the isolation compartment of reactive gas trapped within the isolation compartment.

In some other embodiments, a load port is provided. The load port includes an isolation compartment for an elevator defined by a housing and a frame, the isolation compartment including a volume isolated from a volume of an equipment front end module (EFEM) couplable to the load port; and a purge supply within the isolation compartment operable to purge the isolation compartment of reactive gas trapped within the isolation compartment.

In yet other embodiments, a method for purging an equipment front end module (EFEM) system is provided. The method includes flooding an EFEM with a gas non-reactive to substrates to be passed through the EFEM system; and purging an isolation compartment of a load port coupled to the EFEM of reactive gas trapped within the isolation compartment using a non-reactive gas supply disposed within the isolation compartment.

Still other features, aspects, and advantages of embodiments will become more fully apparent from the following detailed description, the appended claims, and the accompanying drawings by illustrating a number of example embodiments and implementations, including the best mode contemplated for carrying out the embodiments. Embodiments of may also be capable of other and different applications, and its several details may be modified in various respects, all without departing from the scope of the disclosed embodiments. Accordingly, the drawings and descriptions are to be regarded as illustrative in nature, and not as restrictive. The drawings are not necessarily drawn to scale. The description is intended to cover all modifications, equivalents, and alternatives falling within the scope of the claims.

DETAILED DESCRIPTION

Embodiments described herein provide systems, apparatus, and methods for an improved load port to an equipment front end module (EFEM) for an electronic device manufacturing system. An EFEM typically provides an enclosed environment filled with a gas (e.g., nitrogen) that is not reactive with substrates to be loaded into a processing tool. The EFEM includes a robot that enables transfer of substrates between the cleanroom environment (e.g., from within sealed substrate carriers via a load port) and the interior of the processing system. In use, the EFEM is ideally maintained in a positive pressure, nitrogen-only environment. However, an airtight seal is not continuously maintained between the cleanroom and the EFEM. For example, during maintenance, oxygen is introduced into the EFEM to allow personnel to safely enter. Afterward, the EFEM is again flooded with nitrogen to force out remaining oxygen.

The inventors have determined that conventional load ports coupled to EFEMs can trap oxygen which can remain in an isolation compartment of the load port and the oxygen can slowly leak out into the EFEM, particularly when the carrier opener of the load port is opened and lowered during substrate transfer from a docked substrate carrier. The isolation compartment is an enclosed volume within the lower portion of the load port within which an elevator translates up and down to lower and raise the carrier opener of the load port when opening a substrate carrier. The isolation compartment is in fluid communication with the EFEM and the movement of the elevator can push trapped oxygen out of the isolation compartment into the EFEM. In addition, slow leaking of oxygen from the isolation compartment of the load port after the EFEM has been flooded with nitrogen is particularly problematic because the oxygen, which is reactive with substrate materials, can contaminate substrates moved though the EFEM. Embodiments solve this problem by providing a dedicated nitrogen purge supply within the isolation compartment of the load port that is operative to force out the trapped oxygen so the oxygen can be removed when the EFEM is flooded with nitrogen. In some embodiments, a fan within the isolation compartment is used to force oxygen out of the load port, with or without the dedicated nitrogen purge supply. In some embodiments, a fan within the EFEM is used to pull oxygen out of the load port, with or without the dedicated nitrogen purge supply.

Figure 1A:
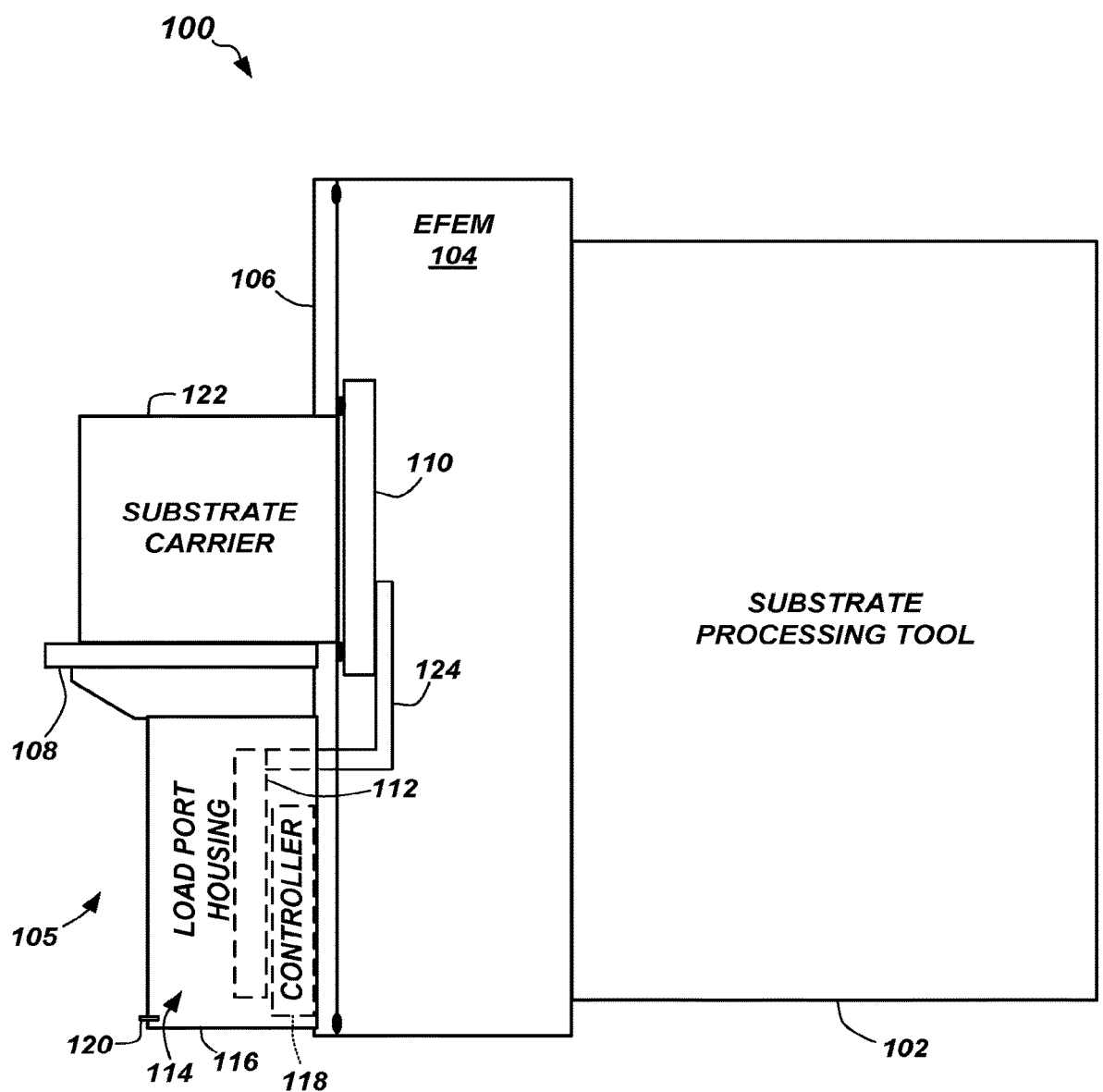
FIGS. 1A and 1B are block diagrams depicting an example of an electronic device processing system according to some embodiments.
Figure 1B:
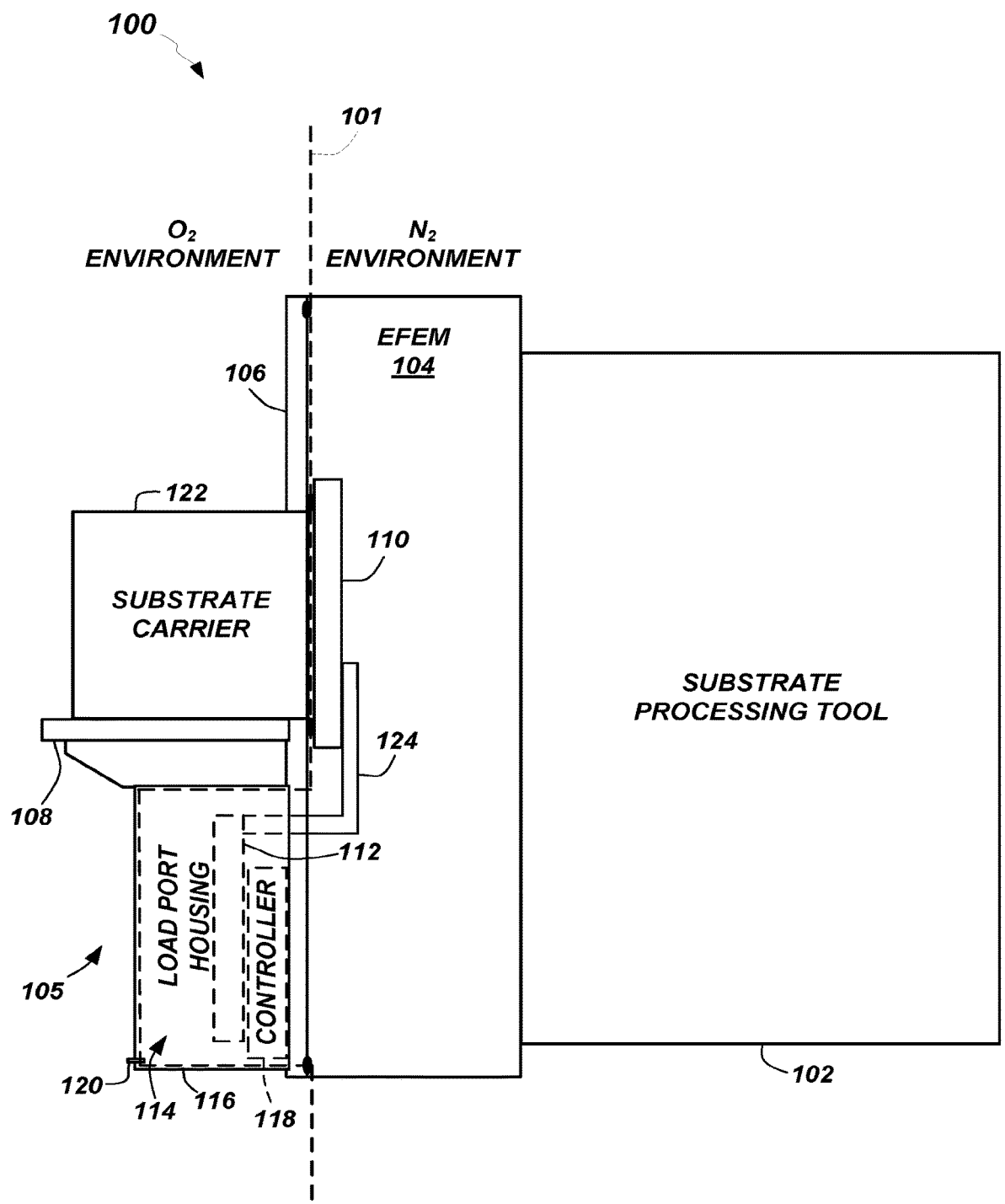

Turning to FIGS. 1A and 1B, block diagrams of an example electronic device processing system 100 according to some embodiments is shown. FIG. 1B depicts the same system 100 as FIG. 1A but includes a vertical dashed line 101 demarcating the boundary between an oxygen (e.g., reactive) environment and a nitrogen (e.g., non-reactive) environment. The system 100 includes a substrate processing tool 102 coupled to an EFEM 104. The EFEM 104 is coupled to a load port 105 which includes a frame 106 supporting a docking tray 108, an carrier opener 110, an elevator 112, and an isolation compartment 114 surrounded by a load port housing 116. The load port housing 116 also encloses a control components board supporting a controller 118, and an isolation compartment purge supply 120.

The docking tray 108 is adapted to receive a substrate carrier 122 (e.g., a front opening unified pod (FOUP)). The substrate carrier 122 is accessed via the carrier opener 110 which is lowered out of the way via the elevator 112 that moves the carrier opener 110 up and down in the EFEM 104, carried by an elevator arm 124 that extends from the elevator 112 in the isolation compartment 114. The isolation compartment 114 contains the elevator 112. Note that the volume enclosed by load port housing 116, i.e., the isolation compartment 114, is in fluid communication with the EFEM 104 due to an opening (See FIG. 3, 302) for moving elements that extend through the frame 106.

As illustrated by the vertical dashed line 101 in FIG. 1B, elements on the left side of the system 100 may be maintained in an oxygen environment, e.g., a cleanroom, while elements on the right side of the system 100 are ideally maintained in a non-reactive gas (e.g., nitrogen) environment. A gas is selected to be non-reactive relative to the substrate.

In operation, the EFEM 104 is initially flooded with nitrogen to force out oxygen. However, oxygen gets trapped in the isolation compartment 114 and is purged using the dedicated isolation compartment purge supply 120 disposed within the isolation compartment 114. Alternatively or additionally, isolation compartment 114 (i.e., the volume enclosed by the load port housing 116) is purged using a fan disposed within the load port housing 116 or is drawn out using a fan or vacuum source within the EFEM 104 adjacent the isolation compartment 114. Once the oxygen has been flushed out of the EFEM 104, a substrate carrier 122 can be docked at the load port 105 to deliver or receive substrates to or from the substrate processing tool 102. The carrier opener 110 is lowered via elevator 112. The substrates are inserted into or removed from the substrate carrier 122 via a robot (not shown) and then the carrier opener 110 is raised to reseal the substrate carrier 122. Shown in phantom in FIGS. 1A and 1B, the controller 118 (including a programed processor and memory storing processor executable instructions) within the load port housing 116 can be coupled to each of the active components to control operation thereof.

In some embodiments, the purge supply 120 within the isolation compartment 114 is disposed at a lower end of the isolation compartment 114 and arranged to force trapped reactive gas up out of the isolation compartment 114. In some embodiments, the purge supply 120 within the isolation compartment 114 is disposed at an upper end of the isolation compartment 114 and arranged to force trapped reactive gas down out of the isolation compartment 114. In some embodiments, the isolation compartment 114 includes a vent opening disposed at an end of the isolation compartment 114 opposite the purge supply 120. The vent opening can include a one-way check valve to allow gas out of the isolation compartment but not back in. In some embodiments, the purge supply 120 can be replaced with a fan disposed in any of the arrangements described above for the purge supply 120.

Figure 2A:
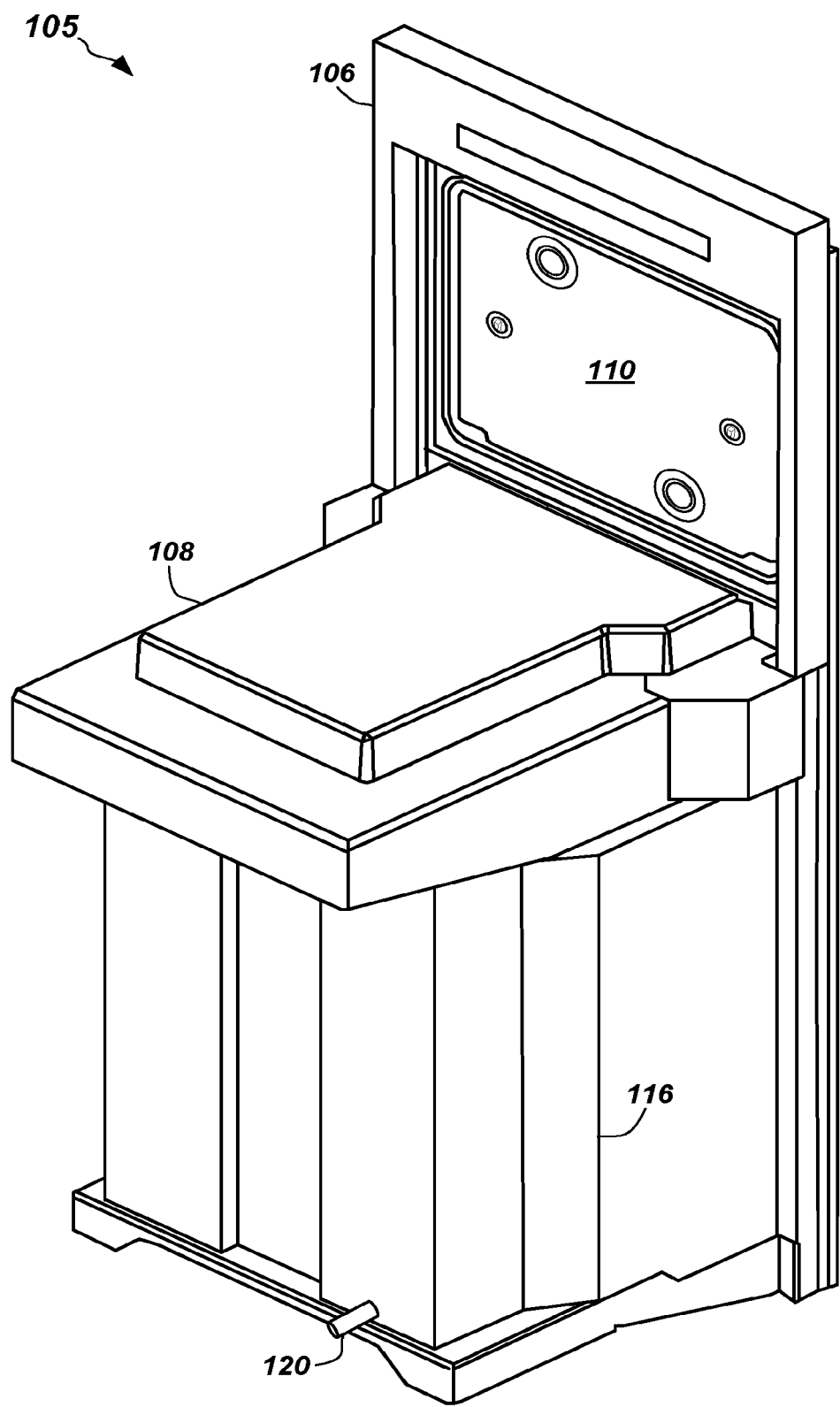
FIG. 2A is a front isometric view diagram depicting an example load port with a lower housing installed according to some embodiments.
Figure 2B:
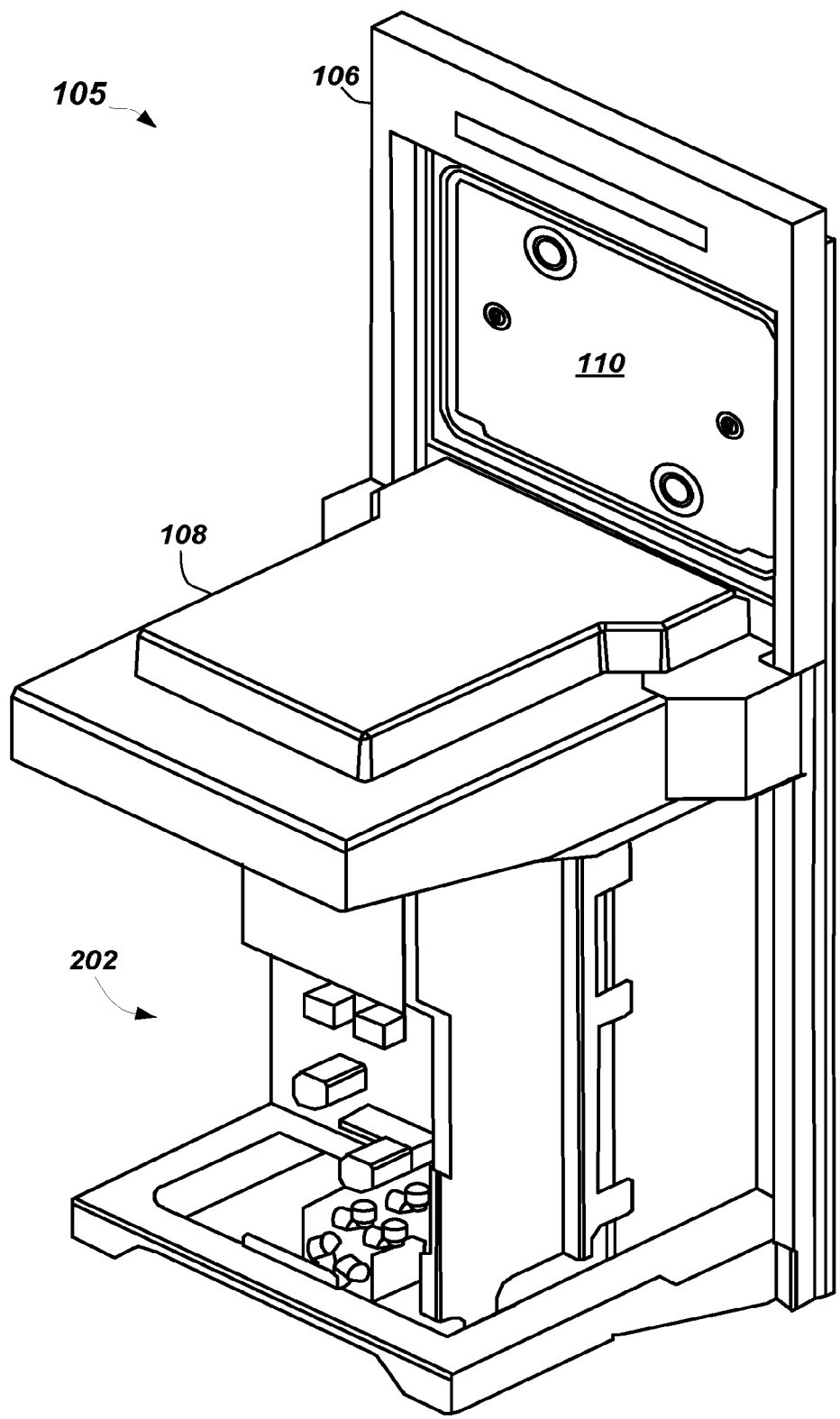
FIG. 2B is a front isometric view diagram depicting an example load port with a lower housing removed according to some embodiments.

FIGS. 2A and 2B depict front isometric views of an example embodiment of a load port 105. Note that in FIG. 2A, the load port housing 116 is installed and in FIG. 2B, the load port housing 116 has been removed. Also note that in FIGS. 2A & 2B, as well as in FIGS. 3 and 4, the same reference numeral is used to reference the same component even when a different view of the component is shown. IN FIG. 2B, the control components board 202 mentioned above with respect to FIGS. 1A and 1B, is visible.

Figure 3:
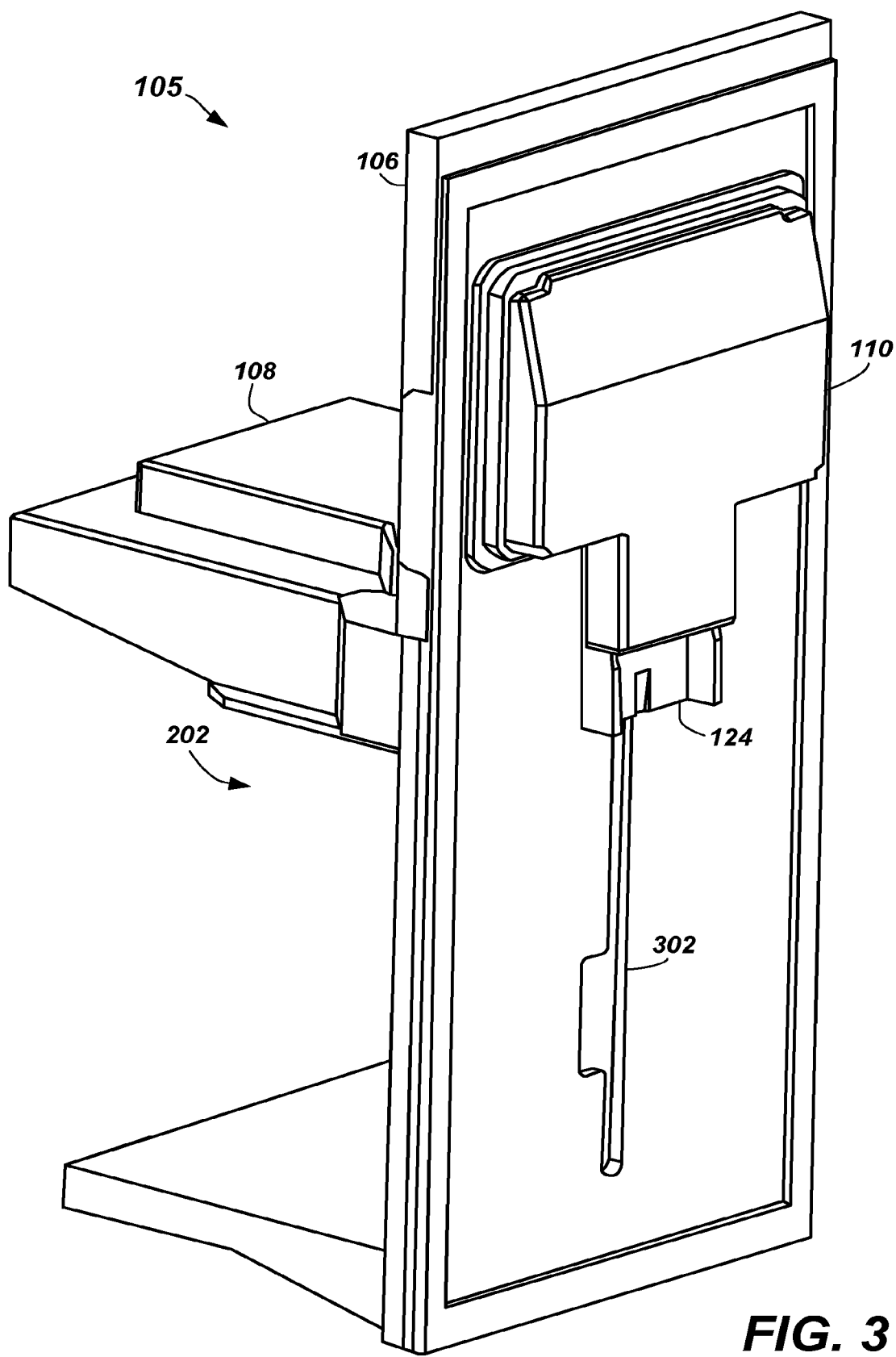
FIG. 3 is a rear isometric view diagram depicting an example load port according to some embodiments.
Figure 4:
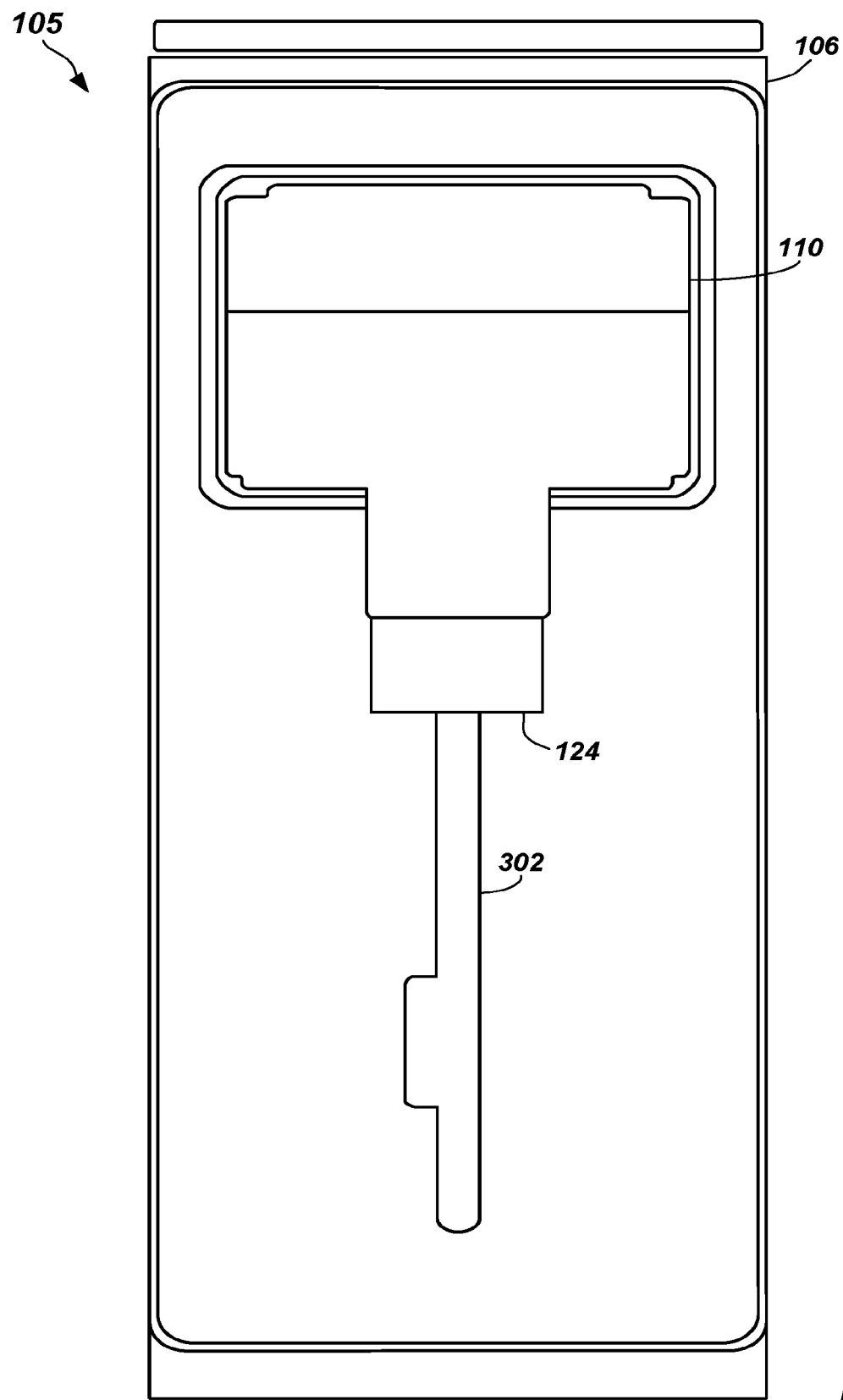
FIG. 4 is a rear plan view diagram depicting an example load port according to some embodiments.

FIG. 3 depicts a back isometric view and FIG. 4 depicts a back plan view of the example embodiment of a load port 105. The opening 302 to the isolation compartment 114 is clearly shown in these drawings. The volume within the isolation compartment 114 is partially isolated from the volume within the EFEM 104 (FIG. 1) but due to the opening 302 for the elevator arm 124, the isolation compartment 114 is in fluid communication with the EFEM 104. Note that the opening 302 is minimized in order minimize particle migration into the EFEM 104 environment. Thus, there are two volumes separated by opening 302, the EFEM 104 environment and the isolation compartment 114 volume. Because there is only a small opening 302 connecting the two volumes, reactive gas is trapped inside the isolation compartment 114 volume unless a purge supply 120 is introduced. If trapped oxygen is not purged from the isolation compartment 114, oxygen leaks out into the volume within the EFEM 104, particularly when the elevator 112 moves through the isolation compartment 114 to lower or raise the carrier opener 110.

In some embodiments, the isolation compartment purge supply 120 provides a non-reactive gas (e.g., nitrogen) at a rate within the range of approximately 10 to approximately 100 lpm and at a pressure within the range of approximately 0.5 in WC to approximately 3 in WC. Other ranges are possible. In some embodiments, an EFEM purge supply (not shown) provides a non-reactive gas (e.g., nitrogen) at a rate within the range of approximately 20 lpm to approximately 1000 lpm and at a pressure within the range of approximately 0.5 in WC to approximately 3 in WC. Other ranges are possible. In alternative embodiments that include a fan, a fan can be selected that moves of approximately 10 to approximately 100 lpm of gas.

Figure 5:
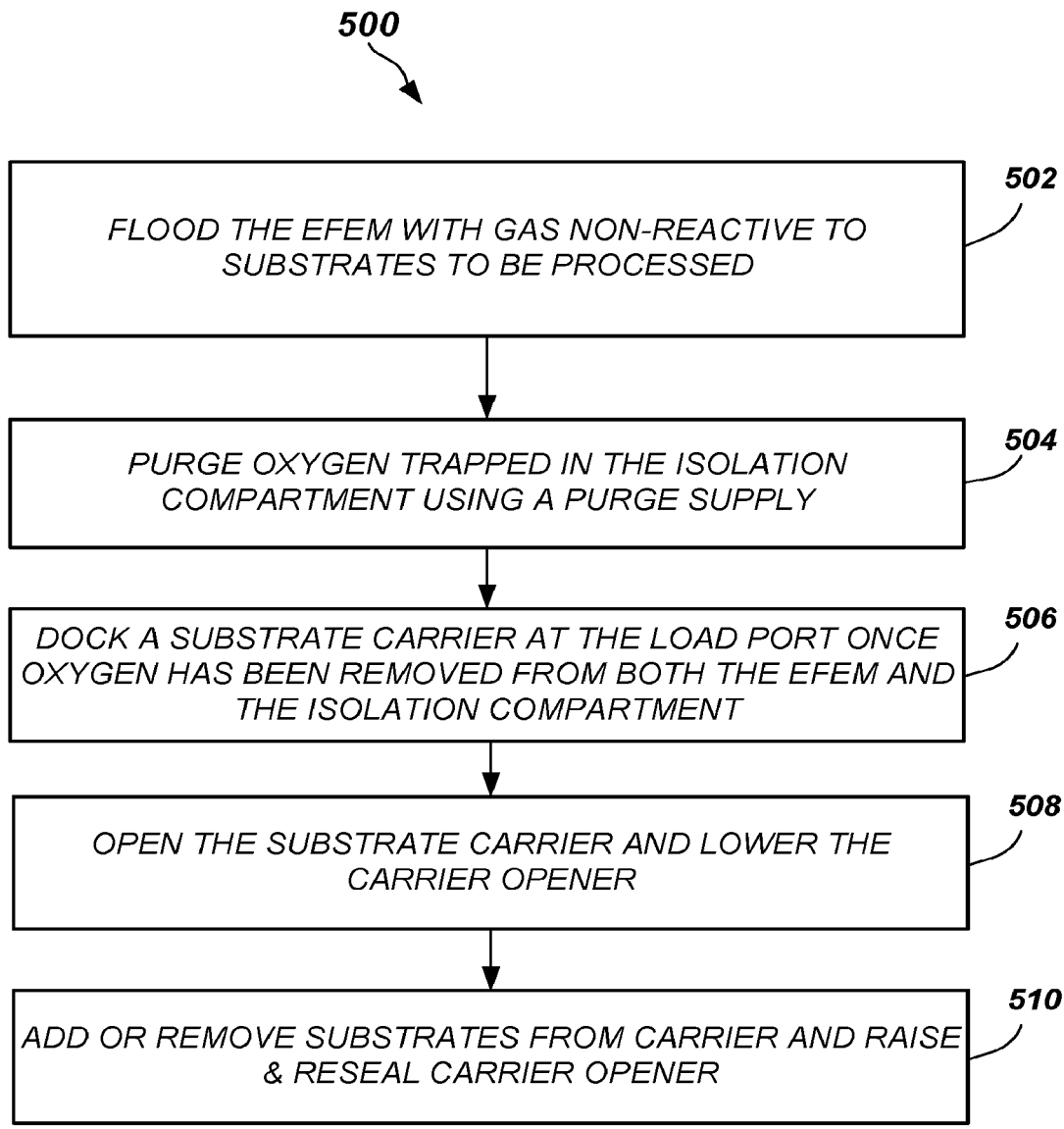
FIG. 5 is a flowchart illustrating an example method of purging an electronic device processing system according to some embodiments.

Turning now to FIG. 5, a flowchart depicting an example method 500 of embodiments is provided. Initially, the substrate processing tool 102 side of the system 100 (i.e., the EFEM 104) is flooded with a non-reactive gas (e.g., nitrogen) to force out oxygen (502). Concurrently or after a delay, oxygen trapped in the isolation compartment 114 is purged using the dedicated isolation compartment purge supply 120 (504). Alternatively or additionally, a fan is used to purge the isolation compartment 114 of any trapped oxygen. After the oxygen has been flushed out of the isolation compartment 114 and the EFEM 104, a substrate carrier 122 can be docked at the load port 105 (506). Alternatively, a substrate carrier 122 can be docked at the load port 105 and then the isolation compartment 114 and the EFEM 104 are purged before opening the substrate carrier 122. The carrier opener 110 opens the substrate carrier 122 and is then lowered via elevator 112 with the door of the substrate carrier 122 (508). Substrates are inserted into or removed from the substrate carrier 122 and then the carrier opener 110 is raised to reseal the substrate carrier 122 (510).

Numerous embodiments are described in this disclosure, and are presented for illustrative purposes only. The described embodiments are not, and are not intended to be, limiting in any sense. The presently disclosed embodiments are widely applicable to numerous other embodiments, as is readily apparent from the disclosure. One of ordinary skill in the art will recognize that the disclosed embodiments may be practiced with various modifications and alterations, such as structural, logical, software, and electrical modifications. Although particular features of the disclosed embodiments may be described with reference to one or more particular embodiments and/or drawings, it should be understood that such features are not limited to usage in the one or more particular embodiments or drawings with reference to which they are described, unless expressly specified otherwise.

The present disclosure is neither a literal description of all embodiments nor a listing of features of the embodiments that must be present in all embodiments. The present disclosure provides, to one of ordinary skill in the art, an enabling description of several embodiments. Some of these embodiments may not be claimed in the present application, but may nevertheless be claimed in one or more continuing applications that claim the benefit of priority of the present application.

The foregoing description discloses only example embodiments. Modifications of the above-disclosed apparatus, systems and methods which fall within the scope of the claims will be readily apparent to those of ordinary skill in the art. Accordingly, while the embodiments have been disclosed in connection with exemplary embodiments thereof, it should be understood that other embodiments may fall within the intended scope, as defined by the claims.

What is claimed is:

1. A load port system comprising:
an isolation compartment coupled to an equipment front end module (EFEM), wherein reactive gas is to be removed from the isolation compartment; and
an elevator disposed in the isolation compartment, wherein the elevator is coupled to an elevator arm that extends from the isolation compartment into the EFEM through an opening to raise and lower a carrier opener within the EFEM, wherein the elevator arm comprises a first portion that extends from the isolation compartment into the EFEM through the opening and a second portion that extends from the first portion within the EFEM, the first portion and the second portion being substantially perpendicular to each other.

2. The load port system of claim 1, wherein the reactive gas is to be removed from the isolation compartment via a non-reactive purge gas provided into the isolation compartment.

3. The load port system of claim 1 further comprising:
a non-reactive purge gas supply disposed in the isolation compartment, wherein the non-reactive purge gas supply is configured to remove the reactive gas from the isolation compartment.

4. The load port system of claim 1 further comprising:
a fan disposed in the isolation compartment, wherein the fan is configured to remove the reactive gas from the isolation compartment.

5. The load port system of claim 1, wherein a fan is disposed in the EFEM, wherein the fan is configured to remove the reactive gas from the isolation compartment.

6. The load port system of claim 1 further comprising:
a vent comprising a one-way check valve to allow the reactive gas out of the isolation compartment.

7. The load port system of claim 1, wherein a first volume of the isolation compartment is partially isolated from a second volume of the EFEM, and wherein the isolation compartment is in fluid communication with the EFEM via the opening.

8. An isolation compartment system comprising:
a housing partially enclosing an interior volume, the housing forming an opening, wherein the housing is configured to couple to an equipment front end module (EFEM), and wherein reactive gas is to be removed from the housing; and
an elevator system disposed at least partially in the interior volume, wherein the elevator system comprises an elevator arm that is configured to couple to a carrier opener via the opening to raise and lower the carrier opener within the EFEM, wherein the elevator arm comprises a first portion that extends into the EFEM through the opening and a second portion that extends from the first portion within the EFEM, the first portion and the second portion being substantially perpendicular to each other.

9. The isolation compartment system of claim 8, wherein the elevator system comprises:
an elevator disposed in the interior volume; and
the elevator arm coupled to the elevator, wherein the elevator arm is configured to extend from the housing into the EFEM through the opening to raise and lower the carrier opener within the EFEM.

10. The isolation compartment system of claim 8, wherein the reactive gas is to be removed from the housing via a non-reactive purge gas provided into the housing.

11. The isolation compartment system of claim 8, wherein a non-reactive purge gas supply is disposed in the housing, and wherein the non-reactive purge gas supply is configured to remove the reactive gas from the housing.

12. The isolation compartment system of claim 8, wherein a fan is disposed in the housing, wherein the fan is configured to remove the reactive gas from the housing.

13. The isolation compartment system of claim 8, wherein a fan is disposed in the EFEM, wherein the fan is configured to remove the reactive gas from the housing.

14. The isolation compartment system of claim 8 further comprising:
a vent comprising a one-way check valve configured to allow the reactive gas out of the housing.

15. A system comprising
a memory; and
a processor coupled to the memory, the processor configured to:
cause reactive gas to be removed from an isolation compartment housing coupled to an equipment front end module (EFEM); and
actuate an elevator disposed in the isolation compartment housing, wherein the elevator is coupled to an elevator arm that extends from the isolation compartment housing into the EFEM through an opening to raise and lower a carrier opener within the EFEM, wherein the elevator arm comprises a first portion that extends from the isolation compartment into the EFEM through the opening and a second portion that extends from the first portion within the EFEM, the first portion and the second portion being substantially perpendicular to each other.

16. The system of claim 15, wherein the processor is disposed in the isolation compartment housing.

17. The system of claim 15, wherein the reactive gas is to be removed from the isolation compartment housing via a non-reactive purge gas provided into the isolation compartment housing.

18. The system of claim 15, wherein a non-reactive purge gas supply is disposed in the isolation compartment housing, and wherein the non-reactive purge gas supply is configured to remove the reactive gas from the isolation compartment housing.

19. The system of claim 15, wherein a fan is disposed in the isolation compartment housing or in the EFEM, wherein the fan is configured to remove the reactive gas from the isolation compartment housing.

20. The system of claim 15, wherein a vent comprising a one-way check valve is configured to allow the reactive gas out of the isolation compartment housing.

* * * * *